United States Patent [19]
Sawada et al.

[11] Patent Number: 5,772,860
[45] Date of Patent: Jun. 30, 1998

[54] HIGH PURITY TITANIUM SPUTTERING TARGETS

[75] Inventors: Susumu Sawada, Tokyo; Hideaki Fukuyo; Masaru Nagasawa, both of Kitaibaraki, all of Japan

[73] Assignee: Japan Energy Corporation, Tokyo, Japan

[21] Appl. No.: 308,234

[22] Filed: Sep. 19, 1994

[30] Foreign Application Priority Data

| Sep. 27, 1993 | [JP] | Japan | 5-260380 |
| Sep. 27, 1993 | [JP] | Japan | 5-260381 |
| Sep. 27, 1993 | [JP] | Japan | 5-260382 |
| Sep. 27, 1993 | [JP] | Japan | 5-260383 |
| Sep. 27, 1993 | [JP] | Japan | 5-260384 |

[51] Int. Cl.$^6$ ............................................. C23C 14/34
[52] U.S. Cl. ............................... 204/298.13; 204/192.12
[58] Field of Search ....................... 204/192.12, 192.15, 204/298.13

[56] References Cited

U.S. PATENT DOCUMENTS

| 4,842,706 | 6/1989 | Fukasawa et al. | 204/298.13 |
| 5,155,063 | 10/1992 | Ito | 204/298.12 X |
| 5,456,815 | 10/1995 | Fukuyo et al. | 204/298.13 |

FOREIGN PATENT DOCUMENTS 0 480 409  4/1992  European Pat. Off. .

OTHER PUBLICATIONS

G. R. Haupt et al., *Molecular Crystals and Liquid Crystals, Letters Series 2.* vol. 7, No. 2, 1 Mar. 1990 "Drift In Film Recrystallization", abstract.

Wickersham, C.E., Jr., *Journal of Vacuum Science & Technology A*, second series, vol. 5, No. 4 part III, Jul./Aug. 1994, "Crystallographic Target effects in magnetron sputtering", pp. 1755–1758.

*Primary Examiner*—Nam Nguyen
*Attorney, Agent, or Firm*—Seidel, Gonda, Lavorgna & Monaco, PC

[57] ABSTRACT

A high-purity titanium sputtering target having controlled crystal characteristics. The uniform problem of film thickness distribution on a substrate can be solved by adopting the requirements that (a) the average crystal grain diameters at various portions of the sputtering surface of the target are 500 μm or less, preferably 100 μm or less, and their dispersions are within ±20%, and (b) the defined orientation content ratios A have dispersions within ±20% and (c) a Ti target crystal structure has a recrystallization structure. The problems in connection with particle generation and lowered film forming rate in collimation sputtering can be solved by adopting the requirements that (d) said orientation content ratios A are is 80% or less, preferably 50% or less, and (e) the defined orientation content ratios B are 20% or less, as necessary, in combination with the aforementioned (a) to (c) requirements.

18 Claims, No Drawings

HIGH PURITY TITANIUM SPUTTERING TARGETS

FIELD OF THE INVENTION

This invention relates to high purity titanium sputtering targets, and more specifically to sputtering targets of high purity titanium having crystal characteristics notably different from those in conventional titanium targets wherein the average crystal grain diameter and/or crystal orientation and further crystal structure are stipulated so as to meet forthcoming requirements for the fabrication of future semiconductor devices.

PRIOR ART

Sputtering targets are usually disk-shaped plates, which serve as sources of substances to be sputtered on substrates to form thereon electrodes, gates, conductors, elements, insulating films, protective films and the like of various semiconductor devices. As accelerated particles impinge on a target surface, the atoms constituting the target are partly released by momentum exchange through the space to deposit on an oppositely located substrate. Typical sputtering targets in use include the targets made of Al and Al alloys, refractory metals and their alloys (W, Mo, Ti, Ta, Zr, Nb, etc. and their alloys such as W-Ti), and metal silicides ($MoSi_x$, $WSi_x$, $NiSi_x$, etc.).

Among these targets, one type attracting particular attention because of its importance are Ti targets, which are used for forming Ti circuit lines or wirings, Ti protective films, etc.

In recent years, wafers of 6 inch diameter have been replaced by larger wafers of 8 inch diameter additionally, circuit lines have become finer to 0.5 $\mu$m or narrower in width. Accordingly, the standards required for the uniformity of thin films to be formed on wafers by sputtering have become stricter in order to better secure the characteristics of the finer circuit lines. Namely, compared with the former standard deviation ($\sigma$) of dispersion of film thickness distribution of 5% or less, the present-day requirement is that the three-fold value of the standard deviation ($3\sigma$) should be 5% or less. Under these circumstances, reexamination of the equipment, conditions, targets, and other parameters of sputtering is under way with the aim of improving the uniformity of thickness of the resulting films. It is clear that with conventional Ti target quality, different targets and even the same target produce films with thickness distribution so widely dispersed or varied that the films do not meet the above standards ($3\sigma<5\%$).

As important as the uniformity of film thickness, the generation of particles during the formation of a sputtered film is drawing much attention as a cause of circuit breaking and shorting. Since the tendency is toward finer circuit line widths and interspaces, the need to control the particle generation becomes a key factor in the film-forming process for enhancing the yield of LSI production. In particular, TiN films formed by reactive sputtering of Ti targets in a nitrogen atmosphere have recently come into wide use as barrier layers. Since TiN film deposited layers inherently have high film stresses and brittleness, TiN film layers that are continuously and thickly deposited on the inside walls of a sputter chamber, besides wafers, tend to peel off and act as a chief generation source of particles. Another particle generation source in the reactive sputtering process are the TiN layers that deposit in a laminar pattern or in the form of islands on the peripheral or central portions of a Ti target that are relatively slightly eroded or not eroded by sputtering. Improvements in and investigations of sputtering apparatus and conditions that can control the particle generation from these TiN layers are under way.

There is still another problem. As the circuit lines are being made as narrow in width as 0.5 $\mu$m or less, the aspect ratios (depth/diameter) of through holes and contact holes are increased to 2 or more. Collimation sputtering process is attracting attention as a technique for filling those holes with an undercoat Ti or TiN. The collimation sputtering process is a technique which uses a collimator interposed between a target and a substrate during sputtering, so that only sputtered atoms that are perpendicular to the substrate can reach the substrate through the collimator. The advantage of the collimation sputtering is that it achieves a bottom coverage of 10% or more with the hole aspect ratios of 2 or more, thus satisfying the process requirement typically, less than 10% coverage is attained with hole aspect ratios of 2 or more in conventional sputtering. A drawback to collimation sputtering is that the film-forming speed drops to about one-fifth that of ordinary sputtering due to the presence of the collimator.

As regards these three problems, i.e., the standards as to the film thickness distribution, particle generation, and lowered film-forming speed of the collimation sputtering process, improvements and reconsideration have been made mostly on the sputtering devices and conditions. Not much weight has been given to the quality of target itself. It is generally known that the surface and internal material structure and crystal structure (crystal grain size, orientation, etc.) of a crystalline material that constitutes a target largely influence the atom releasing characteristics on sputtering of the target. This suggests that, with Ti targets too, difference and unevenness of material structure and crystal structure have important bearings upon the atom releasing characteristics, directionality, etc. at the time of sputtering.

The influence of crystal orientation upon the film thickness uniformity of sputtered thin films is dealt with, e.g., in a paper entitled "Crystallographic target effects in magnetron sputtering" by C. E. Wickersharm Jr. that appeared in J. Vac. Sci. Technol. A, Vol. 15, No. 4, July/August, 1967, pp. 1755–1768. Much research has hitherto been made on targets of aluminum rather than titanium. Japanese Patent Application Public Disclosure No. 312975/1988 discloses an aluminum sputtering target characterized in that the orientation content ratio {220}/{200} in the central region of the target is greater than that of the peripheral region, in the light of the film thickness distribution of an aluminum thin film formed by sputtering on a wafer such that the central region is thick and the peripheral region thin. Patent Application Public Disclosure No. 15167/1990 introduces an aluminum sputtering target having the (111) crystal plane accounting for at least 50% of the target surface area. Patent Application Public Disclosure No. 2369/1991 proposes decreasing the orientation intensity ratio {100}/{110} of a target from the outer surface inwardly for the purpose of solving the problem with an aluminum target that, as the target is consumed by magnetron sputtering, a ring-shaped groove is formed on the surface along the path of rotation of the magnet, with concurrent variation in the atom releasing direction and deterioration of film thickness distribution. Patent Application Public Disclosure No. 10709/1991 describes an aluminum target characterized by an orientation content ratio {220}/{200} on the sputter surface of 0.5 or more. Further, Patent Application Public disclosure No. 2346170/1992 discloses an aluminum target having a grain size of 2 mm or less and a <110> fiber texture in which the fiber axis has an X-ray diffraction intensity of more than 20 times the random value.

There is, however, no literature which directly describes the material and crystal characteristics of Ti target in connection with the aforementioned problems in Ti target as far as the inventors know.

OBJECT OF THE INVENTION

The object of this invention is to develop Ti targets capable of lessening or solving the problem of standards with regard to film thickness distribution. That is, the object of the invention is to produce Ti targets enabling the formation of sputtered films having a uniform thickness characterized by a three-fold value of standard deviation (3σ) of uniform thickness distribution of 5% or less.

Another object of this invention is to develop Ti targets capable of lessening or solving not only the problem of film thickness distribution standards, but also the problems of particle generation and the film-forming speed of the collimation sputtering process.

SUMMARY OF THE INVENTION

In an effort to solve the above problem, we have investigated the effects of crystal structure, crystal grain size, and crystal orientation upon film thickness distribution which have not been considered in conventional Ti targets. It has now been found, as the result, that the uniformity problem of film thickness distribution can be lessened or solved by adopting, either singly or in combination, the requirements that (a) the average crystal grain diameters at various portions of the sputtering surface of the target be 500 μm or less, preferably 100 μm or less, and the dispersions of the average crystal grain diameters from their average value are within ±20%, and (b) the orientation content ratios A in connection with (002), (103), (014) and (015) planes and as measured by X-ray diffraction at various portions of the sputtering surface of the target and calculated on the basis of the given numerical formula have dispersions within ±20% and (c) a Ti target crystal structure has a recrystallization structure.

On the basis of the above findings, this invention provides:

(1) a high-purity titanium sputtering target characterized in that the average crystal grain diameters at various portions of the sputtering surface of the target are 500 μm or less and the dispersions of said average crystal grain diameters are within ±20%, (2) a high-purity titanium sputtering target characterized in that the orientation content ratios A in connection with the (002), (103), (014) and (015) planes and as measured by X-ray diffraction at various portions of the sputtering surface of of the target and calculated on the basis of the given numerical formula have dispersions within ±20%, (3) a high-purity titanium sputtering target characterized in that (a) the average crystal grain diameters at various portions of the sputtering surface of the target are 500 μm or less and the dispersions of said average crystal grain diameters are within ±20% and (b) the orientation content ratios A in connection with the (002), (103), (014) and (015) planes and as measured by X-ray diffraction at various portions of the sputtering surface of the target and calculated on the basis of the given numerical formula have dispersions within ±20%, (4) the target of any one of (1) to (3) wherein the crystal structure of the target is a recrystallization structure, (5) The target of any one of (1) to (3) wherein the average crystal grain diameters at various portions of the sputtering surface of the target are 100 μm or less, and (6) A high-purity titanium sputtering target characterized in that (a) the crystal structure of the target is a recrystallization structure, (b) the average crystal grain diameters at various portions of the sputtering surface of the target are 100 μm or less and the dispersions of said average crystal grain diameters are within ±20% and (c) the orientation content ratios A in connection with (002), (103), (014) and (015) planes and as measured by X-ray diffraction at various portions of the sputtering surface of the target and calculated on the basis of the given numerical formula have dispersions within ±20%.

Further, it has now been found that the above problems of particle generation and film-forming speed of the collimation sputtering process that could not have been tackled with the quality of conventional Ti targets can be lessened or solved by adopting the requirements that (d) said orientation content ratios A in connection with the (002), (103), (014) and (015) planes are 80% or less, preferably 50% or less, and (e) the orientation content ratios B in connection with the (012) plane and as measured by X-ray diffraction at various portions of the sputtering surface of the target and calculated on the basis of the following numerical formula are 20% or less, either singly or in combination, and further, as necessary, in combination with the aforementioned (a) to (c) requirements.

On the basis of the above additional findings, this invention also provides:

(7) a high-purity titanium sputtering target characterized in that the orientation content ratios A in connection with the (002), (103), (014) and (015) planes and as measured by X-ray diffraction at various portions of the sputtering surface of the target and calculated on the basis of the given numerical formula are 80% or less, (8) a high-purity titanium sputtering target characterized in that (a) the orientation content ratios A in connection with the (002), (103), (014) and (015) planes and as measured by X-ray diffraction at various portions of the sputtering surface of the target and calculated on the basis of the given numerical formula are 80% or less and (b) said orientation content ratios A have dispersions within ±20%, (9) a high-purity titanium sputtering target characterized in that (a) the orientation content ratios A in connection with the (002), (103), (014) and (015) planes and as measured by X-ray diffraction at various portions of the sputtering surface of the target and calculated on the basis of the given numerical formula are 80% or less (b) the orientation content ratios B in connection with the (002) plane and as measured by X-ray diffraction at various portions of the sputtering surface of the target and calculated on the basis of the given numerical formula are 20% or less,

(10) a high-purity titanium sputtering target characterized in that (a) the orientation content ratios A in connection with the (002), (103), (014) and (015) planes and as measured by X-ray diffraction at various portions of the sputtering surface of the target and calculated on the basis of the given numerical formula are 80% or less, (b) said orientation content ratios A have dispersions within ±20%; and (c) the orientation content ratios B in connection with the (002) plane and as measured by X-ray diffraction at various portions of the sputtering surface of the target and calculated on the basis of the given numerical formula are 20% or less,

(11) a high-purity titanium sputtering target characterized in that (a) the average crystal grain diameters at various portions of the sputtering surface of the target are 500 µm or less and the dispersions of said average crystal grain diameters are within ±20% and (b) the orientation content ratios A in connection with the (002), (103), (014) and (015) planes and as measured by X-ray diffraction at various portions of the sputtering surface of the target and calculated on the basis of the given numerical formula are 80% or less,

(12) a high-purity titanium sputtering target characterized in that (a) the average crystal grain diameters at various portions of the sputtering surface of the target are 500 µm or less and the dispersions of said average crystal grain diameters are within±20%, (b) the orientation content ratios A in connection with the (002), (103), (014) and (015) planes and as measured by X-ray diffraction at various portions of the sputtering surface of the target and calculated on the basis of the given numerical formula are 80% or less and (c) said orientation content ratios A have dispersions within ±20%,

(13) a high-purity titanium sputtering target characterized in that (a) the average crystal grain diameters at various portions of the sputtering surface of the target are 500 µm or less and the dispersions of said average crystal grain diameters are within ±20%, (b) the orientation content ratios A in connection with the (002), (103), (014) and (015) planes and as measured by X-ray diffraction at various portions of the sputtering surface of the target and calculated on the basis of the given numerical formula are 80% or less and (c) the orientation content ratios B in connection with the (002) plane and as measured by X-ray diffraction at various portions of the sputtering surface of the target and calculated on the basis of the given numerical formula are 20% or less,

(14) a high-purity titanium sputtering target characterized in that (a) the average crystal grain diameters at various portions of the sputtering surface of the target are 500 µm or less and the dispersions of said average crystal grain diameters are within ±20%, (b) the orientation content ratios A in connection with the (002), (103), (014) and (015) planes and as measured by X-ray diffraction at various portions of the sputtering surface of the target and calculated on the basis of the given numerical formula are 80% or less and (c) said orientation content ratios A have have dispersions within ±20%, and (d) the orientation content ratios B in connection with the (002) plane and as measured by X-ray diffraction at various portions of the sputtering surface of the target and calculated on the basis of the given numerical formula are 20% or less.

(15) the high-purity titanium sputtering target of any one of (7) to (14) wherein said orientation content ratios A in connection with the (002), (103), (014) and (015) planes are 50% or less,

(16) the target of any one of (7) to (14) wherein the crystal structure of the target is a recrystallization structure,

(17) The target of any one of (7) to (14) wherein said average crystal grain diameters at various portions of the sputtering surface of the target are 100 µm or less, and

(18) A high-purity titanium sputtering target characterized in that (a) the crystal structure of the target is a recrystallization structure, (b) the average crystal grain diameters at various portions of the sputtering surface of the target are 100 µm or less and the dispersions of said average crystal grain diameters are within±20%, (c) the orientation content ratios A in connection with the (002), (103), (014) and (015) planes and as measured by X-ray diffraction at various portions of the sputtering surface of the target and calculated on the basis of the given numerical formula are 50% or less, (d) said orientation content ratios A have dispersions within ±20% and (e) the orientation content ratios B in connection with the (002) plane and as measured by X-ray diffraction at various portions of the sputtering surface of the target and calculated on the basis of the given numerical formula are 20% or less.

DEFINITION OF TERMS

The term "the orientation content ratios A in connection with the (002), (103), (014) and (015) planes" are the % ratio of the of sum of intensities of (002), (103), (014) and (015) planes relative to the total intensities of the whole target sputtering surface. Intensities are measured by X-ray diffraction at various portions of the sputtering surface of the target and calculated on the basis of the following numerical formula (1). "Dispersions" are the deviation (%) of the orientation content ratios A at various portions of sputtering surface of the target from the averaged orientation content ratios A of the whole target sputtering surface.

The term "the orientation content ratios B in connection with the (002) plane" is the % ratio of intensity of the (002) plane relative to the total intensities of the whole target sputtering surface which are measured by X-ray diffraction at the sputtering surfaces of various portions of the target and calculated on the basis of the following numerical formula (2).

$$\left\langle \begin{matrix} \text{Orientation} \\ \text{content ratio } A \end{matrix} \right\rangle = \frac{\dfrac{I_{(002)}}{R_{(002)}} + \dfrac{I_{(103)}}{R_{(103)}} + \dfrac{I_{(014)}}{R_{(014)}} + \dfrac{I_{(015)}}{R_{(015)}}}{\Sigma \dfrac{I_{(hkl)}}{R_{(hkl)}}} \quad \text{Formula 1}$$

$$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$

$$\frac{I_{(110)}}{R_{(110)}} + \frac{I_{(103)}}{R_{(103)}} + \frac{I_{(200)}}{R_{(200)}} + \frac{I_{(112)}}{R_{(112)}} + \frac{I_{(201)}}{R_{(201)}} +$$

$$\frac{I_{(004)}}{R_{(004)}} + \frac{I_{(202)}}{R_{(202)}} + \frac{I_{(014)}}{R_{(014)}} + \frac{I_{(203)}}{R_{(203)}} + \frac{I_{(211)}}{R_{(211)}} +$$

$$\frac{I_{(114)}}{R_{(114)}} + \frac{I_{(212)}}{R_{(212)}} + \frac{I_{(015)}}{R_{(015)}} + \frac{I_{(204)}}{R_{(204)}} + \frac{I_{(300)}}{R_{(300)}} +$$

$$\frac{I_{(213)}}{R_{(213)}} + \frac{I_{(302)}}{R_{(302)}}$$

[where $I_{(hkl)}$ is the peak intensity of the $(hkl)$ plane obtained by X-ray diffraction and $R_{(hkl)}$ is the relative intensity ratio of the $(hkl)$ plane (refer to JCPDS Card).]

$$\left\langle \begin{matrix} \text{Orientation} \\ \text{content ratio } B \end{matrix} \right\rangle = \frac{\dfrac{I_{(002)}}{R_{(002)}}}{\Sigma \dfrac{I_{(hkl)}}{R_{(hkl)}}} \quad \text{Formula 2}$$

$$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$

$$\frac{I_{(110)}}{R_{(110)}} + \frac{I_{(103)}}{R_{(103)}} + \frac{I_{(200)}}{R_{(200)}} + \frac{I_{(112)}}{R_{(112)}} + \frac{I_{(201)}}{R_{(201)}} +$$

-continued $$\frac{I_{(004)}}{R_{(004)}} + \frac{I_{(202)}}{R_{(202)}} + \frac{I_{(014)}}{R_{(014)}} + \frac{I_{(203)}}{R_{(203)}} + \frac{I_{(211)}}{R_{(211)}} +$$

$$\frac{I_{(114)}}{R_{(114)}} + \frac{I_{(212)}}{R_{(212)}} + \frac{I_{(015)}}{R_{(015)}} + \frac{I_{(204)}}{R_{(204)}} + \frac{I_{(300)}}{R_{(300)}} +$$

$$\frac{I_{(213)}}{R_{(213)}} + \frac{I_{(302)}}{R_{(302)}}$$

$$\begin{bmatrix} \text{where } I_{(hkl)} \text{ is the peak intensity of the } (hkl) \text{ plane} \\ \text{obtained by X-ray diffraction and } R_{(hkl)} \text{ is the relative} \\ \text{intensity ratio of the } (hkl) \text{ plane (refer to } JCPDS \text{ Card).} \end{bmatrix}$$

DETAILED EXPLANATION OF THE INVENTION

The average crystal grain diameters at various portions of the sputtering surface of the target are restricted to 500 μm or less. If the grain sizes are coarsened to the extent that average crystal grain sizes are in excess of 500 μm, differences in atom releasing characteristics of the individual crystal grains become so pronounced that uneven film thickness distribution results. Preferably, the average crystal grain diameters at various portions of the sputtering surface of the target are 100 μm or less.

The dispersions of average crystal grain diameters at various portions of the sputtering surface of a target from the average of the crystal grain diameters of the whole target sputtering surface are specified to be within ±20%. This is because dispersions of more than ±20% will cause increased differences in sputtering rates of various portions of the sputtering surface, leading to unevenness of film thickness distribution.

In connection with the film thickness uniformity, the crystal structure of the target is preferably specified to be a recrystallization structure. This is for obtaining thermal stabilization of the crystal structure. If the crystal structure is allowed to remain deformed, the target crystal structure would undergo recovery or partial recrystallization due to the temperature rise at the time of sputtering. The qualitative change of the target crystal structure, in turn, causes variation of the film thickness distribution with time.

The orientation content ratios A in connection with the (002), (103), (014) and (015) planes, as measured by X-ray diffraction at various portions of the sputtering surfaces of the target, are specified to have dispersions within ±20% from the average of the orientation content ratios of the whole target sputtering surface. The reason for this specification is as follows. When plastic working of pure titanium for the fabrication of targets is performed by forging, rolling or the like, a crystal texture having a (002) plane inclined at an angle within ±35° to the sputtering surface of the target is formed accompanied with an increase in the working ratio. The crystal orientation property of this typical crystal texture of titanium with the (002) plane inclined at an angle within ±35° is evaluated by X-ray diffraction. Because the individual diffraction peaks correspond to the crystal planes parallel to the sputtering surface of the target, as shown in Table 1, the diffraction peaks of the crystal planes at interplane angles of less than 35° from the (002) plane, i.e., the (103) plane with an inclination of 30°, the (014) plane with an inclination of 24°, and the (015) plane with an inclination of 20° tend to increase with the crystal texture. These planes must also be taken into consideration besides the (002) plane. The orientation content ratio depends largely on the method of plastic working used and the reduction ratio but it is not as largely correlated with the state of the crystal structure. Since the crystal structure can be adjusted while maintaining the given orientation content ratio, it is not necessary to specify the absolute value of the orientation content ratio A so far as varied sputtering rate at various portions of the target sputtering surface concerned. Nevertheless, the orientation content ratios A at various portions of the target sputtering surface must be specified to have dispersions within ±20% from the average of the orientation content ratios of the whole target sputtering surface. This is because dispersions of more than ±20% will sharpen the differences in sputtering rates of the various portions of the sputtering surface and thereby cause unevenness of film thickness distribution.

In order to prevent the generation of particles, the orientation content ratios A at the various portions of the sputtering surface of the target should be 80% or less. In addition, it is preferred that the orientation content ratios in connection with the (002) plane be 20% or less. The reason why the orientation content ratio A is specified to be 80% or less and the orientation content ratio B is preferably specified to be 20% or less is as follows. Generally, it is known that there is a high probability of sputtered atoms flying out in the direction of the closest packed atom row. When the target is strongly oriented in the (002) plane, the individual crystal grain surfaces that constitute the target erosion surface are more likely in the (002) plane. Since the closest atom row direction is in the (002) plane and that is the closest packed atomic plane, the probability of sputtered atoms flying out parallel to the erosion surface is increased. This means that, as a consequence, the greater the orientation of the (002) plane the larger the number of sputtered atoms that are captured by sloped surfaces corresponding to microscopic irregularities of the erosion surface of the target. it causes the growth of the TiN layers that deposit in laminar fashion or as islands on the peripheral and central portions of the target. The tendency is more pronounced when the orientation content ratios A are more than 80% or when the orientation content ratios B are more than 20%.

It is preferable that the average crystal grain diameters at various portions of the sputtering surface of a target be 100 μm or less. Generally, the micromorphology of the erosion surface of a target is composed of crystal grains corresponding to the crystal structure of the target, and the larger the crystal grain diameter the greater the microscopic irregularities of the erosion surface. This means that the probability of atoms sputtered in parallel with the erosion surface of the target being captured by sloped surfaces corresponding to the surface irregularities increases with the crystal grain diameter. Consequently, the TiN layers that deposit in laminar or as islands on the peripheral and central portions of the target also grow. The tendency becomes noticeable when the average crystal grain diameters are larger than 100 μm.

In the collimation sputtering, it is also desirable that the orientation content ratios A be 50% or less and the orientation content ratios B be 20% or less. The reasons that ratios A and B are so restricted are that since the probability of sputtered atoms flying out is generally high in the direction of the closest packed atom row as explained above, the orientation in the (002) plane of the target is kept low and the crystal grain planes that constitute the erosion surface of the target are so oriented that the probability of the sputtered atoms flying out parallel to the erosion surface for the crystal faces other than the (002) plane is reduced. The proportion of the sputtered atoms flying out perpendicularly to the target erosion surface is increased. Consequently, the number of sputtered atoms that are captured by the collimater during sputtering decreases. More sputtered atoms pass through the collimator with the increase of film formation speed, improving the bottom coverage of holes. If the orientation content ratios B are more than 20% and the orientation content ratios A are more than 50%, the influence of the (002) plane crystal orientation becomes strong.

The orientation content ratios are measured by a procedure now to be described. The deformed layer of a test specimen is removed from the surface chemically by electrolytic polishing or other technique. Next, an X-ray diffractometer is used in determining the intensities of diffracted lines corresponding to individual crystal orientations. The diffraction intensity values thus obtained are corrected with the relative intensity ratios of the diffracted lines in those orientations (refer to the JCPDS Card), and the orientation content ratios are calculated from the corrected intensities. The method of calculating the orientation content ratios A and B is illustrated in Table 1.

TABLE 1

| Crystal index | Relative intensity ratio (JCPDS Card) | Measured intensity value | Corrected intensity | Interplane angle to (002) plane |
|---|---|---|---|---|
| (010) | 30 | A | A/30 | 90.0° |
| (002) | 26 | B | B/26 | 0° |
| (011) | 100 | C | C/100 | 61.0° |
| (012) | 19 | D | D/19 | 42.0° |
| (110) | 17 | E | E/17 | 90° |
| (105) | 16 | F | F/16 | 31.0° |
| (200) | 2 | G | G/2 | 90° |
| (112) | 16 | H | H/16 | 57.3° |
| (201) | 13 | I | I/13 | 74.5° |
| (004) | 2 | J | J/2 | 0° |
| (202) | 2 | K | K/2 | 61.0° |
| (014) | 3 | L | L/3 | 24.2° |
| (203) | 6 | M | M/6 | 50.2° |
| (211) | 11 | N | N/11 | 78.2° |
| (114) | 10 | O | O/10 | 37.95° |
| (212) | 4 | P | P/4 | 67.2° |
| (013) | 4 | Q | Q/4 | 19.8° |
| (204) | 2 | R | R/2 | 42.0° |
| (300) | 4 | S | S/4 | 90° |
| (213) | 12 | T | T/12 | 57.8° |
| (302) | 9 | U | U/9 | 69.7° |

Note: The (004) and (300) planes are excluded because they are equivalent to the (002) and (200) planes, respectively.

The expression "high-purity titanium" as used herein as the material for the sputtering target of this invention denotes titanium with a purity of 4N (99.99%) or above. The aforesaid quality, or set of characteristics, of the target according to this invention can be adjusted by the combination of plastic working, such as rolling or forging, and heat treatment. Actually, the concrete degrees of qualitative adjustments cannot generally be specified because they depend greatly upon the purity of target material, cast structure, methods of plastic working and heat treatment, etc. However, if the target material, cast structure, plastic working and heat treatment methods, etc. are specified, the conditions required for plastic working and heat treatment to obtain the desired quality levels can be found with ease by those skilled in the art.

For example, in order to attain the condition that the average crystal grain diameters at various portions of the target sputtering surface should be 500 $\mu$m or less and their dispersions be within ±20%, the following procedure is performed. A titanium ingot is hot worked above the recrystallization temperature of the material to destroy its cast structure and make the grain size uniform. Also, to impart an ultimate, uniform and fine recrystallization structure, warm or cold working is uniformly performed below the recrystallization temperature to obtain a desired final shape. The resulting target is then evenly heat treated in the recrystallization temperature range of the material to complete the recrystallization. In this case, the recrystallization temperature of the material depends chiefly on the purity of the material and the conditions of plastic working performed prior to the heat treatment.

In order to attain the condition that the orientation content ratios A have dispersions within ±20%, it is essential in the above described working process to carry out uniform warm or cold working to a working ratio of at least 0.3, and then heat treat the whole target uniformly in the recrystallization temperature range of the material so as to complete the recrystallization. If the working ratio is less than 0.3, a uniform orientation content ratio corresponding to the recrystallization structure after the heat treatment cannot be attained.

In order to realize both conditions of average crystal grain diameter and orientation content ratios A, it is simply necessary to adopt working methods that satisfy both conditions.

For example, in order to attain the condition that the orientation content ratios A be 80% or less and the orientation content ratios B be 20% or less, it is necessary in the above process to perform uniform warm working to a working ratio of 1.5 or less and then uniformly heat treat the whole target in the recrystallization temperature range of the material until recrystallization is concluded.

In order to attain the condition that the orientation content ratios A be 50% or less and the orientation content ratios B be 20% or less, it is necessary that the above process should be adjusted so that uniform warm working is carried out to a working ratio of 0.8 or less and then uniform heat treatment is given to the whole target in the recrystallization temperature range of the material until recrystallization is concluded.

The average crystal grain sizes of various portions were measured in conformity with the cutting method prescribed in JIS (Japanese Industrial Standard) H0501.

EXAMPLES

This invention is illustrated by the following examples and comparative examples. These examples are not intended to restrict this invention.

Example 1-1

Targets A, B, and C having different crystal structures and crystal orientation contents A as shown in Table 2 were made from high-purity titanium ingots by plastic working and heat treatment. They were flat disks about 320 mm in diameter and about 6 mm thick. Targets A, B, and C were fabricated as follows:

(A) Target A:
   A high-purity titanium ingot was hot worked at 700° C. and then warm worked at 275° C. to a working ratio of 2.0. The whole target was heat treated uniformly at 600° C. for one hour.

(B) Target B:
   A high-purity titanium ingot was hot worked at 700° C. warm worked at 275° C. to a working ratio of 2.0, and heat treated at 550° C. for one hour using a heat treating furnace with a narrow range of soaking temperature distribution.

(C) Target C:

A high-purity titanium ingot was hot worked at 800° C. and a forged material was warm worked at 275° C., one side half to a working ratio of 1.8 and the remaining half to 0.9. The whole target was thereafter heat treated uniformly at 680° C. for one hour.

Each target was set in a magnetron type sputtering apparatus to form a film on an 8-in. wafer. The thickness distribution of the film was calculated by conversion from sheet resistance values measured at 121 points of the wafer by the four-terminal method. Table 3 shows the standard deviation ($\sigma$) of thickness distribution of the film formed by sputtering of each target. As Table 3 indicates, of Targets A and B both of which had uniform orientation content ratios A, Target A that had an average crystal grain diameter of about 100 $\mu$m and had uniform crystal grain diameter throughout produced a film having superior thickness uniformity than the film of Target B. Target B had different crystal grain diameters in the periphery and the central portion despite a smaller average crystal grain diameters of about 80 $\mu$m. Target C, which differs in the orientation content ratio A and grain size with the side, left or right, gave a film that shows substantial unevenness of thickness.

TABLE 2

| Target | Peripheral portion 1 | Peripheral portion 2 | Peripheral portion 3 | Peripheral portion 4 | Central portion |
|---|---|---|---|---|---|
| A | 98 | 93 | 104 | 99 | 106 |
|   | 0.82 | 0.83 | 0.78 | 0.81 | 0.76 |
| B | 72 | 75 | 78 | 81 | 141 |
|   | 0.84 | 0.81 | 0.81 | 0.79 | 0.77 |
| C | 350 | 353 | 233 | 251 | 245 |
|   | 0.52 | 0.55 | 0.80 | 0.82 | 0.79 |

Grain diameter (upper row, in $\mu$m)
Orientation content ratio A (lower row)

TABLE 3

| Target | A | B | C |
|---|---|---|---|
| Standard deviation of film thickness distribution (%) | 1.30 | 1.78 | 2.35 |

Example 1-2

Similarly, a high-purity titanium ingot was hot worked at 700° C., warm worked at 275° C. to a working ratio of 2.0, and then the whole target thus made was heat treated uniformly at 600° C. for one hour to obtain a target with a complete recrystallization structure. For comparison purposes, another target was made by lowering the heating temperature so that recrystallization does not occur. In the same way as in the preceding examples, each target was set in a magnetron type sputtering apparatus, a film was formed by sputtering on an 8-inch wafer, and the film thickness distribution was determined. The target with a complete recrystallization structure was superior in film thickness distribution.

Example 1-3

A high-purity titanium ingot was hot worked at 800° C. warm worked at 275° C. to a working ratio of 2.0, and the whole target obtained was heat treated uniformly at 700° C. for one hour. A target with a crystal grain diameter on the order of 300 $\mu$m was obtained. In a similar manner but after heat treatment for a period of two hours, another target with a crystal grain diameter on the order of 500 $\mu$m was obtained. The target with the crystal grain diameter level of 300 $\mu$m showed better film thickness distribution.

Example 1-4

Two targets were made with the same crystal grain diameter but with different dispersions of orientation content ratios A, one having a maximum dispersion of 5% and the other having dispersions of 23% or more. The former proved better in film thickness distribution.

Example 2-1

Targets A, B, and C having different crystal structures and crystal orientation properties as shown in Table 4 were made from high-purity titanium ingots by plastic working and heat treatment. They were flat disks about 320 mm in diameter and about 6 mm thick. Targets A, B, and C were fabricated as follows:

(A) Target A:

A high-purity titanium ingot was hot worked at 750° C. and then warm worked at 400° C. to a working ratio of 1.5. The whole target was heat treated uniformly at 630° C. for one hour.

(B) Target B:

A high-purity titanium ingot was hot worked at 750° C. warm worked at 400° C. to a working ratio of 1.5, and heat treated at 600° C. for one hour using a heat treating furnace with a narrow range of soaking temperature distribution.

(C) Target C:

A high-purity titanium ingot was hot worked at 800° C. and a forged material was warm worked at 400° C., one side half to a working ratio of 2.0 and the remaining half to 1.1. The whole target was thereafter heat treated uniformly at 600° C. for one hour.

Each target was set in a magnetron type sputtering apparatus to form a film on an 8-in. wafer. The thickness distribution of the film was calculated by conversion from sheet resistance values measured at 121 points of the wafer by the four-terminal method. Table 5 shows the standard deviation ($\sigma$) of thickness distribution of the film formed by sputtering of each target. As Table 5 indicates, of Targets A and B, both of which have uniform orientation content ratios A, Target A has an average crystal grain diameter of about 120 $\mu$m and uniform crystal grain diameter throughout and produced a film of superior thickness uniformity than the film of Target B. Target B had different crystal grain diameters in the periphery and the central portion despite a smaller average crystal grain diameter of about 80 $\mu$m. Target C differs in the orientation content ratio A and crystal grain diameter with the side, left or right, and gave a film that shows substantial unevenness of thickness.

TABLE 4

| Target | Peripheral portion 1 | Peripheral portion 2 | Peripheral portion 3 | Peripheral portion 4 | Central portion |
|---|---|---|---|---|---|
| A | 121 | 130 | 115 | 116 | 119 |
|   | 0.83 | 0.79 | 0.81 | 0.77 | 0.80 |
| B | 93 | 97 | 91 | 95 | 137 |

Grain diameter (upper row, in $\mu$m)
Orientation content ratio A (lower row)

TABLE 4-continued

| Target | Grain diameter (upper row, in μm) Orientation content ratio A (lower row) | | | | |
|---|---|---|---|---|---|
| | Peripheral portion 1 | Peripheral portion 2 | Peripheral portion 3 | Peripheral portion 4 | Central portion |
| C | 0.79 | 0.77 | 0.82 | 0.84 | 0.81 |
| | 141 | 152 | 97 | 102 | 99 |
| | 0.63 | 0.59 | 0.79 | 0.83 | 0.81 |

TABLE 5

| Target | A | B | C |
|---|---|---|---|
| Standard deviation of film thickness distribution (%) | 1.43 | 1.83 | 2.28 |

Example 2-2

A high-purity titanium ingot was hot worked at 800° C. warm worked at 275° C. to a working ratio of 2.0, and then the whole target thus made was heat treated uniformly at 680° C. for one hour. A target with a crystal grain diameter on the order of 280 μm was obtained. In a similar manner, but after heat treatment for a period of two hours, another target with a crystal grain diameter on the order of 450 μm was obtained. The target with the grain size level of 280 μm showed better film thickness distribution.

Example 3-1

Targets A, B, and C having different crystal structures and crystal orientation properties as shown in Table 6 were made from high-purity titanium ingots by plastic working and heat treatment. They were flat disks about 320 mm in diameter and about 6 mm thick. Targets A, B, and C were fabricated as follows:

(A) Target A:
A high-purity titanium ingot was hot worked at 750° C. and then warm worked at 400° C. to a working ratio of 1.5. The whole target was heat treated uniformly at 600° C. for one hour. It did not have a complete recrystallization structure but retained a deformation structure.

(B) Target B:
A high-purity titanium ingot was hot worked at 750° C. warm worked at 400° C. to a working ratio of 2.0, and heat treated at 600° C. for one hour using a heat treating furnace with a narrow range of soaking temperature distribution. The target structure was not a complete recrystallization structure but retained a deformation structure.

(C) Target C:
A high-purity titanium ingot was hot worked at 750° C. and a forged material was warm worked at 400° C., one half side to a working ratio of 1.8 and the remaining half to 0.8. The whole target was thereafter heat treated uniformly at 600° C. for one hour. The target structure was not a complete recrystallization structure but retained a deformation structure.

Each target was set in a magnetron type sputtering apparatus to form a film on an 8-inch wafer. The thickness distribution of the film was calculated by conversion from sheet resistance values measured at 121 points of the wafer by the four-terminal method. Table 7 shows the standard deviation (σ) of thickness distribution of the film formed by the sputtering of each target. As Table 7 indicates, of Targets A and B both of which have uniform orientation content ratios A, Target A that has an average crystal grain diameter of about 110 μm and uniform crystal grain diameter throughout, produced a film of superior uniform thickness than the film of Target B. Target B has different crystal grain diameters in the periphery and the central portions, despite a smaller average crystal grain diameter of about 80 μm. Target C differs in the orientation content ratio A and crystal grain diameter with the side, left or right, gave and a film that shows substantial unevenness of thickness.

TABLE 6

| Target | Grain diameter (upper row, in μm) Orientation content ratio A (lower row) | | | | |
|---|---|---|---|---|---|
| | Peripheral portion 1 | Peripheral portion 2 | Peripheral portion 3 | Peripheral portion 4 | Central portion |
| A | 111 | 108 | 109 | 108 | 113 |
| | 0.80 | 0.77 | 0.79 | 0.82 | 0.76 |
| B | 80 | 82 | 78 | 76 | 130 |
| | 0.82 | 0.78 | 0.79 | 0.75 | 0.83 |
| C | 143 | 152 | 102 | 107 | 105 |
| | 0.47 | 0.50 | 0.82 | 0.78 | 0.83 |

TABLE 7

| Target | A | B | C |
|---|---|---|---|
| Standard deviation of film thickness distribution (%) | 1.29 | 1.85 | 2.41 |

Example 3-2

Two targets were made with the same crystal grain diameter but with different dispersions of orientation content ratios A, one having a maximum dispersion of 5% and the other, 18% or more. The former proved better in film thickness distribution.

Example 4-1

Targets A and B having different crystal orientation properties as shown in Table 8, were made from high-purity titanium ingots by plastic working and heat treatment. They were flat disks about 320 mm in diameter and about 6 mm thick. Targets A and B were fabricated as follows:

(A) Target A:
A high-purity titanium ingot was hot worked at 700° C. and then warm worked at 500° C. to a working ratio of 2.0. The whole target was heat treated uniformly at 600° C. for one hour.

(B) Target B:
A high-purity titanium ingot was hot worked at 700° C. and a forged material was warm worked at 500° C., one half side to a working ratio of 2.0 and the remaining half to 0.9. The whole target was thereafter heat treated uniformly at 600° C. for one hour.

Each target was set in a magnetron type sputtering apparatus to form a film on an 8-inch wafer. The thickness distribution of the film was calculated by conversion from sheet resistance values measured at 121 points of the wafer by the four-terminal method. Table 9 shows the standard deviation (σ) of thickness distribution of the film formed by sputtering of each target. As Table 9 indicates, Target A, having uniform orientation content ratios A, produced a film of excellent thickness uniformity. Target B, which differed in the orientation content ratios A with the side, left or right, gave a film showing substantial unevenness of thickness.

TABLE 8

| | Orientation content ratio A | | | | |
|---|---|---|---|---|---|
| Target | Peripheral portion 1 | Peripheral portion 2 | Peripheral portion 3 | Peripheral portion 4 | Central portion |
| A | 0.80 | 0.77 | 0.83 | 0.81 | 0.82 |
| B | 0.49 | 0.55 | 0.83 | 0.81 | 0.79 |

TABLE 9

| Target | A | B |
|---|---|---|
| Standard deviation of film thickness distribution (%) | 1.36 | 2.39 |

Example 5-1

Targets A, B, and C having different crystal structures and crystal orientation properties as shown in Table 10 were made from high-purity titanium ingots by plastic working and heat treatment. They were flat disks about 300 mm in diameter and about 6 mm thick. Targets A, B, and C were fabricated as follows:

(A) Target A:
  A titanium ingot was hot worked at 700° C. and then warm worked at 400° C. to a working ratio of 1.1. The whole target was heat treated uniformly at 600° C. for one hour.
(B) Target B:
  A titanium ingot was hot worked at 700° C., warm worked at 400° C. to a working ratio of 1.1, and heat treated at 700° C. for two hours.
(C) Target C:
  A titanium ingot was hot worked at 700° C., and a forged material was warm worked at room temperature to a working ratio of 1.8, and then the whole target was heat treated uniformly at 700° C. for two hours.

Each target was set in a magnetron type sputtering apparatus to form a film on a 6-in. wafer substrate. Table 11 shows the average number average of particles per piece of wafer when the test targets were used in treating wafers untill the end of target life. The number of the particles on each wafer was counted by a particle counter in terms of the particles 0.3 μm or larger found after the formation of a 0.2 μm thick TiN film. As Table 11 indicates, Target A, with low orientation content ratios A and with the finest grain size, gave the smallest average number of particles. Target B, with low orientation content ratios A and a large grain size and Target C with high orientation content ratios A and a large crystal grain diameter, gave larger average numbers of particles in the order of mention.

TABLE 10

| | Grain diameter (upper row, in μm) | | | | |
|---|---|---|---|---|---|
| | Orientation content ratio A (middle row, %) | | | | |
| | Orientation content ratio B (lower row, %) | | | | |
| Target | Peripheral portion 1 | Peripheral portion 2 | Peripheral portion 3 | Peripheral portion 4 | Central portion |
| A | 85 | 76 | 78 | 79 | 83 |
| | 53 | 47 | 54 | 40 | 52 |
| | 12 | 14 | 10 | 9 | 8 |
| B | 230 | 251 | 246 | 226 | 255 |
| | 54 | 45 | 51 | 54 | 54 |
| | 9 | 8 | 11 | 12 | 12 |
| C | 253 | 245 | 236 | 246 | 242 |
| | 82 | 79 | 86 | 88 | 85 |
| | 23 | 30 | 25 | 20 | 26 |

TABLE 11

| Target | A | B | C |
|---|---|---|---|
| Average number of particles | 17 | 25 | 33 |

Example 5-2

Targets A, and B having different crystal structures and crystal orientation properties as shown in Table 12 were made from high-purity titanium ingots by plastic working and heat treatment. The targets were flat disks about 300 mm in diameter and about 6 mm thick. They were fabricated in the following manner.

(A) Target A:
  A titanium ingot was hot worked at 700° C. and then warm worked at 450° C. to a working ratio of 0.6. The whole target was heat treated uniformly at 600° C. for one hour.
(B) Target B:
  A titanium ingot was hot worked at 700° C., warm worked at 275° C. to a working ratio of 2.0. The whole target was heat treated uniformly throughout at 630° C. for one hour.

Each target was set in a magnetron type sputtering apparatus and, using collimation with an aspect ratio of 1, a film was formed on a 6-inch wafer substrate. Table 13 shows the ratios of film-forming speeds of the targets to the speeds without the use of the collimation. As is manifest from Table 13, Target A (with low orientation content ratios) showed a higher film-forming speed ratio than Target B, which had high orientation content ratios A.

TABLE 12

| | Grain diameter (upper row, in μm) | | | | |
|---|---|---|---|---|---|
| | Orientation content ratio A (middle row, %) | | | | |
| | Orientation content ratio B (lower row, %) | | | | |
| Target | Peripheral portion 1 | Peripheral portion 2 | Peripheral portion 3 | Peripheral portion 4 | Central portion |
| A | 121 | 133 | 130 | 130 | 125 |
| | 0.33 | 0.41 | 0.39 | 0.43 | 0.35 |
| | 0.7 | 0.12 | 0.9 | 0.9 | 0.10 |
| B | 135 | 122 | 133 | 128 | 129 |
| | 0.82 | 0.89 | 0.78 | 0.82 | 0. 88 |
| | 0.27 | 0.31 | 0.24 | 0.33 | 0.23 |

TABLE 13

| Target | A | B |
|---|---|---|
| Film-forming rate ratio | 0.27 | 0.21 |

ADVANTAGES OF THE INVENTION (1) Either with the same or different targets, dispersions and variations of film thickness distribution are less, and stable, excellent film thickness distribution uniformity is shown. This reduces the percent of defective LSI and other circuits formed on wafers.

(2) During sputtering of Ti targets, lower particle generation tendency is obtained. This reduces the percent defective of LSI and other circuits formed on wafers.

(3) During collimation sputtering, either with the same or different targets, dispersions and variations of film forming speed are decreased, and stable, high film-forming speed is attained. This improves the bottom coverage during film forming in a hole and Ti target yield in use.

We claim:

1. A titanium sputtering target having a surface, said target comprising a plurality of crystal grains wherein the average crystal grain diameters at various portions of the sputtering surface of the target are 500 μm or less and the dispersions of said average crystal grain diameters are within ±20%.

2. A titanium sputtering target having a surface including a plurality of crystal grains, said target comprising a plurality of planes consisting of the (002), (103), (014) and (015) planes having orientation content ratios A as measured by X-ray diffraction at various portions of the sputtering surface of the target and calculated on the basis of the numerical formula (1):

$$\text{Orientation content ratio } A = \frac{\frac{I_{(002)}}{R_{(002)}} + \frac{I_{(103)}}{R_{(103)}} + \frac{I_{(014)}}{R_{(014)}} + \frac{I_{(015)}}{R_{(015)}}}{\Sigma \frac{I_{(hkl)}}{R_{(hkl)}}} \quad (1)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$
$$\frac{I_{(110)}}{R_{(110)}} + \frac{I_{(103)}}{R_{(103)}} + \frac{I_{(200)}}{R_{(200)}} + \frac{I_{(112)}}{R_{(112)}} +$$
$$\frac{I_{(201)}}{R_{(201)}} + \frac{I_{(004)}}{R_{(004)}} + \frac{I_{(202)}}{R_{(202)}} + \frac{I_{(014)}}{R_{(014)}} +$$
$$\frac{I_{(203)}}{R_{(203)}} + \frac{I_{(211)}}{R_{(211)}} + \frac{I_{(114)}}{R_{(114)}} + \frac{I_{(212)}}{R_{(212)}} +$$
$$\frac{I_{(015)}}{R_{(015)}} + \frac{I_{(204)}}{R_{(204)}} + \frac{I_{(300)}}{R_{(300)}} + \frac{I_{(213)}}{R_{(213)}} +$$
$$\frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;

wherein said orientation content ratios A have dispersions within ±20%.

3. A titanium sputtering target having a sputtering surface, said target comprising (a) a plurality of crystal grains having average crystal grain diameters at various portions of the sputtering surface of the target of 500 μm or less and the disperson of said average crystal grain diameters is within ±20%, and (b) a plurality of planes consisting of the (002), (103), (014) and (015) planes having orientation content ratios A as measured by X-ray diffraction at various portions of the sputtering surface of the target and calculated on the basis of the numerical formula (1):

$$\text{Orientation content ratio } A = \frac{\frac{I_{(002)}}{R_{(002)}} + \frac{I_{(103)}}{R_{(103)}} + \frac{I_{(014)}}{R_{(014)}} + \frac{I_{(015)}}{R_{(015)}}}{\Sigma \frac{I_{(hkl)}}{R_{(hkl)}}} \quad (1)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$
$$\frac{I_{(110)}}{R_{(110)}} + \frac{I_{(103)}}{R_{(103)}} + \frac{I_{(200)}}{R_{(200)}} + \frac{I_{(112)}}{R_{(112)}} +$$
$$\frac{I_{(201)}}{R_{(201)}} + \frac{I_{(004)}}{R_{(004)}} + \frac{I_{(202)}}{R_{(202)}} + \frac{I_{(014)}}{R_{(014)}} +$$
$$\frac{I_{(203)}}{R_{(203)}} + \frac{I_{(211)}}{R_{(211)}} + \frac{I_{(114)}}{R_{(114)}} + \frac{I_{(212)}}{R_{(212)}} +$$
$$\frac{I_{(015)}}{R_{(015)}} + \frac{I_{(204)}}{R_{(204)}} + \frac{I_{(300)}}{R_{(300)}} + \frac{I_{(213)}}{R_{(213)}} +$$
$$\frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;

wherein said orientation content ratios A have dispersions within ±20%.

4. The target of any one of claims 1 to 3 wherein the crystal structure of the target is a recrystallization structure.

5. The target of any one of claims 1 to 3 wherein the average crystal grain diameters at various portions of the sputtering surface of the target are 100 μm or less.

6. A titanium sputtering target having a surface, said target comprising (a) a recrystallized crystal structure, (b) a plurality of crystal grains having average crystal grain diameters at various portions of the sputtering surface of the target of 100 μm or less, the dispersion of said average crystal grain diameters being within ±20%, and (c) a plurality of planes consisting of the (002), (103), (014) and (015) planes having orientation content ratios A as measured by X-ray diffraction at various portions of the sputtering surface of the target and calculated on the basis of the numerical formula (1):

$$\text{Orientation content ratio } A = \frac{\frac{I_{(002)}}{R_{(002)}} + \frac{I_{(103)}}{R_{(103)}} + \frac{I_{(014)}}{R_{(014)}} + \frac{I_{(015)}}{R_{(015)}}}{\Sigma \frac{I_{(hkl)}}{R_{(hkl)}}} \quad (1)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$
$$\frac{I_{(110)}}{R_{(110)}} + \frac{I_{(103)}}{R_{(103)}} + \frac{I_{(200)}}{R_{(200)}} + \frac{I_{(112)}}{R_{(112)}} +$$
$$\frac{I_{(201)}}{R_{(201)}} + \frac{I_{(004)}}{R_{(004)}} + \frac{I_{(202)}}{R_{(202)}} + \frac{I_{(014)}}{R_{(014)}} +$$
$$\frac{I_{(203)}}{R_{(203)}} + \frac{I_{(211)}}{R_{(211)}} + \frac{I_{(114)}}{R_{(114)}} + \frac{I_{(212)}}{R_{(212)}} +$$
$$\frac{I_{(015)}}{R_{(015)}} + \frac{I_{(204)}}{R_{(204)}} + \frac{I_{(300)}}{R_{(300)}} + \frac{I_{(213)}}{R_{(213)}} +$$
$$\frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;

wherein said orientation content ratios A have a dispersion within ±20%.

7. A titanium sputtering target having a surface including crystal grains, said target comprising a plurality of planes consisting of the (002), (103), (014), and (015) planes having orientation content ratios A as measured by X-ray diffraction at various portions of the sputtering surface of the target and calculated on the basis of the numerical formula (1):

$$\text{Orientation content ratio } A = \frac{\frac{I_{(002)}}{R_{(002)}} + \frac{I_{(103)}}{R_{(103)}} + \frac{I_{(014)}}{R_{(014)}} + \frac{I_{(015)}}{R_{(015)}}}{\Sigma \frac{I_{(hkl)}}{R_{(hkl)}}} \quad (1)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$
$$\frac{I_{(110)}}{R_{(110)}} + \frac{I_{(103)}}{R_{(103)}} + \frac{I_{(200)}}{R_{(200)}} + \frac{I_{(112)}}{R_{(112)}} +$$
$$\frac{I_{(201)}}{R_{(201)}} + \frac{I_{(004)}}{R_{(004)}} + \frac{I_{(202)}}{R_{(202)}} + \frac{I_{(014)}}{R_{(014)}} +$$
$$\frac{I_{(203)}}{R_{(203)}} + \frac{I_{(211)}}{R_{(211)}} + \frac{I_{(114)}}{R_{(114)}} + \frac{I_{(212)}}{R_{(212)}} +$$
$$\frac{I_{(015)}}{R_{(015)}} + \frac{I_{(204)}}{R_{(204)}} + \frac{I_{(300)}}{R_{(300)}} + \frac{I_{(213)}}{R_{(213)}} +$$
$$\frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;
wherein said orientation content ratios A are 80% or less.

8. A titanium sputtering target having a surface including crystal grains, said target comprising a plurality of planes consisting of the (002), (103), (014), and (015) planes having orientation content ratios A as measured by X-ray diffraction at various portions of the sputtering surface of the target and calculated on the basis of the numerical formula (1):

$$\text{Orientation content ratio } A = \frac{\frac{I_{(002)}}{R_{(002)}} + \frac{I_{(103)}}{R_{(103)}} + \frac{I_{(014)}}{R_{(014)}} + \frac{I_{(015)}}{R_{(015)}}}{\Sigma \frac{I_{(hkl)}}{R_{(hkl)}}} \quad (1)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$
$$\frac{I_{(110)}}{R_{(110)}} + \frac{I_{(103)}}{R_{(103)}} + \frac{I_{(200)}}{R_{(200)}} + \frac{I_{(112)}}{R_{(112)}} +$$
$$\frac{I_{(201)}}{R_{(201)}} + \frac{I_{(004)}}{R_{(004)}} + \frac{I_{(202)}}{R_{(202)}} + \frac{I_{(014)}}{R_{(014)}} +$$
$$\frac{I_{(203)}}{R_{(203)}} + \frac{I_{(211)}}{R_{(211)}} + \frac{I_{(114)}}{R_{(114)}} + \frac{I_{(212)}}{R_{(212)}} +$$
$$\frac{I_{(015)}}{R_{(015)}} + \frac{I_{(204)}}{R_{(204)}} + \frac{I_{(300)}}{R_{(300)}} + \frac{I_{(213)}}{R_{(213)}} +$$
$$\frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;
wherein said orientation content ratios are 80% or less and said orientation content ratios A have a dispersion within ±20%.

9. A titanium sputtering target having a surface including crystal grains, said target comprising a plurality of planes consisting of the (002), (103), (014), and (015) planes having orientation content ratios A as measured by X-ray diffraction at various portions of the sputtering surface of the target and calculated on the basis of the numerical formula (1):

$$\text{Orientation content ratio } A = \frac{\frac{I_{(002)}}{R_{(002)}} + \frac{I_{(103)}}{R_{(103)}} + \frac{I_{(014)}}{R_{(014)}} + \frac{I_{(015)}}{R_{(015)}}}{\Sigma \frac{I_{(hkl)}}{R_{(hkl)}}} \quad (1)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$
$$\frac{I_{(110)}}{R_{(110)}} + \frac{I_{(103)}}{R_{(103)}} + \frac{I_{(200)}}{R_{(200)}} + \frac{I_{(112)}}{R_{(112)}} +$$
$$\frac{I_{(201)}}{R_{(201)}} + \frac{I_{(004)}}{R_{(004)}} + \frac{I_{(202)}}{R_{(202)}} + \frac{I_{(014)}}{R_{(014)}} +$$
$$\frac{I_{(203)}}{R_{(203)}} + \frac{I_{(211)}}{R_{(211)}} + \frac{I_{(114)}}{R_{(114)}} + \frac{I_{(212)}}{R_{(212)}} +$$
$$\frac{I_{(015)}}{R_{(015)}} + \frac{I_{(204)}}{R_{(204)}} + \frac{I_{(300)}}{R_{(300)}} + \frac{I_{(213)}}{R_{(213)}} +$$
$$\frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;
wherein said orientation content ratios are 80% or less and the (002) plane has orientation content ratios B as measured by X-ray diffraction at various portions of the sputtering surface of the target and calculated on the basis of the numerical formula (2):

$$\text{Orientation content ratio } B = \frac{\frac{I_{(002)}}{R_{(002)}}}{\Sigma \frac{I_{(hkl)}}{R_{(hkl)}}} \quad (2)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$
$$\frac{I_{(110)}}{R_{(110)}} + \frac{I_{(103)}}{R_{(103)}} + \frac{I_{(200)}}{R_{(200)}} + \frac{I_{(112)}}{R_{(112)}} +$$
$$\frac{I_{(201)}}{R_{(201)}} + \frac{I_{(004)}}{R_{(004)}} + \frac{I_{(202)}}{R_{(202)}} + \frac{I_{(014)}}{R_{(014)}} +$$
$$\frac{I_{(203)}}{R_{(203)}} + \frac{I_{(211)}}{R_{(211)}} + \frac{I_{(114)}}{R_{(114)}} + \frac{I_{(212)}}{R_{(212)}} +$$
$$\frac{I_{(015)}}{R_{(015)}} + \frac{I_{(204)}}{R_{(204)}} + \frac{I_{(300)}}{R_{(300)}} + \frac{I_{(213)}}{R_{(213)}} +$$
$$\frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;
wherein said orientation content ratios B are 20% or less.

10. A titanium sputtering target having a surface, said target comprising a plurality of planes consisting of the (002), (103), (014) and (015) planes having orientation content ratios A as measured by X-ray diffraction at various portions of the sputtering surface of the target and calculated on the basis of the numerical formula (1):

$$\text{Orientation content ratio } A = \frac{\frac{I_{(002)}}{R_{(002)}} + \frac{I_{(103)}}{R_{(103)}} + \frac{I_{(014)}}{R_{(014)}} + \frac{I_{(015)}}{R_{(015)}}}{\Sigma \frac{I_{(hkl)}}{R_{(hkl)}}} \quad (1)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$

$$\frac{I_{(110)}}{R_{(110)}} + \frac{I_{(103)}}{R_{(103)}} + \frac{I_{(200)}}{R_{(200)}} + \frac{I_{(112)}}{R_{(112)}} +$$

$$\frac{I_{(201)}}{R_{(201)}} + \frac{I_{(004)}}{R_{(004)}} + \frac{I_{(202)}}{R_{(202)}} + \frac{I_{(014)}}{R_{(014)}} +$$

$$\frac{I_{(203)}}{R_{(203)}} + \frac{I_{(211)}}{R_{(211)}} + \frac{I_{(114)}}{R_{(114)}} + \frac{I_{(212)}}{R_{(212)}} +$$

$$\frac{I_{(015)}}{R_{(015)}} + \frac{I_{(204)}}{R_{(204)}} + \frac{I_{(300)}}{R_{(300)}} + \frac{I_{(213)}}{R_{(213)}} +$$

$$\frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;

wherein said orientation content ratios A are 80% or less, and said orientation content ratios A have a dispersion of ±20%; and the (002) plane having orientation content ratios B as measured by X-ray diffraction at various portions of the sputtering surface of the target and calculated on the basis of the numerical formula (2):

$$\text{Orientation content ratio } B = \frac{\frac{I_{(002)}}{R_{(002)}}}{\Sigma \frac{I_{(hkl)}}{R_{(hkl)}}} \quad (2)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$

$$\frac{I_{(110)}}{R_{(110)}} + \frac{I_{(103)}}{R_{(103)}} + \frac{I_{(200)}}{R_{(200)}} + \frac{I_{(112)}}{R_{(112)}} +$$

$$\frac{I_{(201)}}{R_{(201)}} + \frac{I_{(004)}}{R_{(004)}} + \frac{I_{(202)}}{R_{(202)}} + \frac{I_{(014)}}{R_{(014)}} +$$

$$\frac{I_{(203)}}{R_{(203)}} + \frac{I_{(211)}}{R_{(211)}} + \frac{I_{(114)}}{R_{(114)}} + \frac{I_{(212)}}{R_{(212)}} +$$

$$\frac{I_{(015)}}{R_{(015)}} + \frac{I_{(204)}}{R_{(204)}} + \frac{I_{(300)}}{R_{(300)}} + \frac{I_{(213)}}{R_{(213)}} +$$

$$\frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;

wherein said orientation content ratios B are 20% or less.

11. A titanium sputtering target having a surface, said target comprising (a) a plurality of crystal grains having average crystal grain diameters at various portions of the sputtering surface of the target of 500 μm or less, wherein the dispersion of said average crystal grain diameters is within ±20% and (b) a plurality of planes consisting of the (002), (103), (014), and (015) planes having orientation content ratios A as measured by X-ray diffraction at various portions of the sputtering surface of the target and calculated on the basis of the numerical formula (1):

$$\text{Orientation content ratio } A = \frac{\frac{I_{(002)}}{R_{(002)}} + \frac{I_{(103)}}{R_{(103)}} + \frac{I_{(014)}}{R_{(014)}} + \frac{I_{(015)}}{R_{(015)}}}{\Sigma \frac{I_{(hkl)}}{R_{(hkl)}}} \quad (1)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$

$$\frac{I_{(110)}}{R_{(110)}} + \frac{I_{(103)}}{R_{(103)}} + \frac{I_{(200)}}{R_{(200)}} + \frac{I_{(112)}}{R_{(112)}} +$$

$$\frac{I_{(201)}}{R_{(201)}} + \frac{I_{(004)}}{R_{(004)}} + \frac{I_{(202)}}{R_{(202)}} + \frac{I_{(014)}}{R_{(014)}} +$$

$$\frac{I_{(203)}}{R_{(203)}} + \frac{I_{(211)}}{R_{(211)}} + \frac{I_{(114)}}{R_{(114)}} + \frac{I_{(212)}}{R_{(212)}} +$$

$$\frac{I_{(015)}}{R_{(015)}} + \frac{I_{(204)}}{R_{(204)}} + \frac{I_{(300)}}{R_{(300)}} + \frac{I_{(213)}}{R_{(213)}} +$$

$$\frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;

wherein said orientation content ratios are 80% or less.

12. A titanium sputtering target having a surface, said target comprising (a) a plurality of crystal grains having average crystal grain diameters at various portions of the sputtering surface of the target of 500 μm or less, wherein the dispersion of said average crystal grain diameters is within ±20%, and (b) a plurality of planes consisting of the (002), (103), (104) and (015) planes having orientation content ratios A as measured by X-ray diffraction at various portions of the sputtering surface of the target and calculated on the basis of the numerical formula (1):

$$\text{Orientation content ratio } A = \frac{\frac{I_{(002)}}{R_{(002)}} + \frac{I_{(103)}}{R_{(103)}} + \frac{I_{(014)}}{R_{(014)}} + \frac{I_{(015)}}{R_{(015)}}}{\Sigma \frac{I_{(hkl)}}{R_{(hkl)}}} \quad (1)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$

$$\frac{I_{(110)}}{R_{(110)}} + \frac{I_{(103)}}{R_{(103)}} + \frac{I_{(200)}}{R_{(200)}} + \frac{I_{(112)}}{R_{(112)}} + \frac{I_{(201)}}{R_{(201)}} +$$

$$\frac{I_{(004)}}{R_{(004)}} + \frac{I_{(202)}}{R_{(202)}} + \frac{I_{(014)}}{R_{(014)}} + \frac{I_{(203)}}{R_{(203)}} + \frac{I_{(211)}}{R_{(211)}} +$$

$$\frac{I_{(114)}}{R_{(114)}} + \frac{I_{(212)}}{R_{(212)}} + \frac{I_{(015)}}{R_{(015)}} + \frac{I_{(204)}}{R_{(204)}} + \frac{I_{(300)}}{R_{(300)}} +$$

$$\frac{I_{(213)}}{R_{(213)}} + \frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;

wherein said orientation content ratios A are 80% or less and said orientation content ratios A have a dispersion within ±20%.

13. A titanium sputtering target having a surface, said target comprising (a) a plurality of crystal grains having average crystal grain diameters at various portions of the sputtering surface of the target of 500 μm or less, wherein the dispersion of said average crystal grain diameters is within ±20%, and (b) a plurality of planes consisting of the (002), (103), (014) and (015) planes having orientation content ratios A as measured by X-ray diffraction at various portions of the sputtering surface of the target and calculated on the basis of the numerical formula (1):

$$\text{Orientation content ratio } A = \frac{\frac{I_{(002)}}{R_{(002)}} + \frac{I_{(103)}}{R_{(103)}} + \frac{I_{(014)}}{R_{(014)}} + \frac{I_{(015)}}{R_{(015)}}}{\Sigma \frac{I_{(hkl)}}{R_{(hkl)}}} \quad (1)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$
$$\frac{I_{(110)}}{R_{(110)}} + \frac{I_{(103)}}{R_{(103)}} + \frac{I_{(200)}}{R_{(200)}} + \frac{I_{(112)}}{R_{(112)}} + \frac{I_{(201)}}{R_{(201)}} +$$
$$\frac{I_{(004)}}{R_{(004)}} + \frac{I_{(202)}}{R_{(202)}} + \frac{I_{(014)}}{R_{(014)}} + \frac{I_{(203)}}{R_{(203)}} + \frac{I_{(211)}}{R_{(211)}} +$$
$$\frac{I_{(114)}}{R_{(114)}} + \frac{I_{(212)}}{R_{(212)}} + \frac{I_{(015)}}{R_{(015)}} + \frac{I_{(204)}}{R_{(204)}} + \frac{I_{(300)}}{R_{(300)}} +$$
$$\frac{I_{(213)}}{R_{(213)}} + \frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;

wherein said orientation content ratios are 80% or less and the (002) plane has orientation content ratios B as measured by X-ray diffraction at various portions of the sputtering surface of the target and calculated on the basis of the numerical formula (2):

$$\text{Orientation content ratio } B = \frac{\frac{I_{(002)}}{R_{(002)}}}{\Sigma \frac{I_{(hkl)}}{R_{(hkl)}}} \quad (2)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$
$$\frac{I_{(110)}}{R_{(110)}} + \frac{I_{(103)}}{R_{(103)}} + \frac{I_{(200)}}{R_{(200)}} + \frac{I_{(112)}}{R_{(112)}} + \frac{I_{(201)}}{R_{(201)}} +$$
$$\frac{I_{(004)}}{R_{(004)}} + \frac{I_{(202)}}{R_{(202)}} + \frac{I_{(014)}}{R_{(014)}} + \frac{I_{(203)}}{R_{(203)}} + \frac{I_{(211)}}{R_{(211)}} +$$
$$\frac{I_{(114)}}{R_{(114)}} + \frac{I_{(212)}}{R_{(212)}} + \frac{I_{(015)}}{R_{(015)}} + \frac{I_{(204)}}{R_{(204)}} + \frac{I_{(300)}}{R_{(300)}} +$$
$$\frac{I_{(213)}}{R_{(213)}} + \frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;

wherein said orientation content ratios B are 20% or less.

14. A titanium sputtering target having a surface, said target comprising (a) a plurality of crystal grains having average crystal grain diameters at various portions of the sputtering surface of the target of 500 μm or less, wherein the dispersion of said average crystal grain diameters is within ±20%, and (b) a plurality of planes consisting of the (002), (103), (014) and (015) planes having orientation content ratios A as measured by X-ray diffraction at various portions of the sputtering surface of the target and calculated on the basis of the numerical formula (1):

$$\text{Orientation content ratio } A = \frac{\frac{I_{(002)}}{R_{(002)}} + \frac{I_{(103)}}{R_{(103)}} + \frac{I_{(014)}}{R_{(014)}} + \frac{I_{(015)}}{R_{(015)}}}{\Sigma \frac{I_{(hkl)}}{R_{(hkl)}}} \quad (1)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$
$$\frac{I_{(110)}}{R_{(110)}} + \frac{I_{(103)}}{R_{(103)}} + \frac{I_{(200)}}{R_{(200)}} + \frac{I_{(112)}}{R_{(112)}} + \frac{I_{(201)}}{R_{(201)}} +$$
$$\frac{I_{(004)}}{R_{(004)}} + \frac{I_{(202)}}{R_{(202)}} + \frac{I_{(014)}}{R_{(014)}} + \frac{I_{(203)}}{R_{(203)}} + \frac{I_{(211)}}{R_{(211)}} +$$
$$\frac{I_{(114)}}{R_{(114)}} + \frac{I_{(212)}}{R_{(212)}} + \frac{I_{(015)}}{R_{(015)}} + \frac{I_{(204)}}{R_{(204)}} + \frac{I_{(300)}}{R_{(300)}} +$$
$$\frac{I_{(213)}}{R_{(213)}} + \frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;

wherein said orientation content ratios A are 80% or less and said orientation content ratios A have dispersions within ±20%, and the (002) plane has orientation content ratios B as measured by X-ray diffraction at various portions of the sputtering surface of the target and calculated on the basis of the numerical formula (2):

$$\text{Orientation content ratio } B = \frac{\frac{I_{(002)}}{R_{(002)}}}{\Sigma \frac{I_{(hkl)}}{R_{(hkl)}}} \quad (2)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$
$$\frac{I_{(110)}}{R_{(110)}} + \frac{I_{(103)}}{R_{(103)}} + \frac{I_{(200)}}{R_{(200)}} + \frac{I_{(112)}}{R_{(112)}} + \frac{I_{(201)}}{R_{(201)}} +$$
$$\frac{I_{(004)}}{R_{(004)}} + \frac{I_{(202)}}{R_{(202)}} + \frac{I_{(014)}}{R_{(014)}} + \frac{I_{(203)}}{R_{(203)}} + \frac{I_{(211)}}{R_{(211)}} +$$
$$\frac{I_{(114)}}{R_{(114)}} + \frac{I_{(212)}}{R_{(212)}} + \frac{I_{(015)}}{R_{(015)}} + \frac{I_{(204)}}{R_{(204)}} + \frac{I_{(300)}}{R_{(300)}} +$$
$$\frac{I_{(213)}}{R_{(213)}} + \frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;

wherein said orientation content ratios B are 20% or less.

15. The titanium sputtering target of any one of claims 7 to 14 wherein said orientation content ratios A are 50% or less.

16. The target of any one of claims 7 to 14 wherein the crystal structure of the target is a recrystallization structure.

17. The target of any one of claims 7 to 14 wherein said average crystal grain diameters at various portions of the sputtering surface of the target are 100 μm or less.

18. A titanium sputtering target having a surface, said target comprising (a) a recrystallized crystal structure, (b) a plurality of crystal grains having average crystal grain diameters at various portions of the target of 100 μm or less, wherein the dispersion of said average crystal grain diameters is within ±20%, and (c) a plurality of planes consisting of the (002), (103), (014) and (015) planes having orientation content ratios A as measured by X-ray diffraction at various portions of the sputtering surface of the target and calculated on the basis of the numerical formula (1):

$$\text{Orientation content ratio } A = \frac{\frac{I_{(002)}}{R_{(002)}} + \frac{I_{(103)}}{R_{(103)}} + \frac{I_{(014)}}{R_{(014)}} + \frac{I_{(015)}}{R_{(015)}}}{\Sigma \frac{I_{(hkl)}}{R_{(hkl)}}} \quad (1)$$

wherein $$\Sigma \frac{I_{(hkl)}}{R_{(hkl)}} \equiv \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$

$$\frac{I_{(110)}}{R_{(110)}} + \frac{I_{(103)}}{R_{(103)}} + \frac{I_{(200)}}{R_{(200)}} + \frac{I_{(112)}}{R_{(112)}} + \frac{I_{(201)}}{R_{(201)}} +$$

$$\frac{I_{(004)}}{R_{(004)}} + \frac{I_{(202)}}{R_{(202)}} + \frac{I_{(014)}}{R_{(014)}} + \frac{I_{(203)}}{R_{(203)}} + \frac{I_{(211)}}{R_{(211)}} +$$

$$\frac{I_{(114)}}{R_{(114)}} + \frac{I_{(212)}}{R_{(212)}} + \frac{I_{(015)}}{R_{(015)}} + \frac{I_{(204)}}{R_{(204)}} + \frac{I_{(300)}}{R_{(300)}} +$$

$$\frac{I_{(213)}}{R_{(213)}} + \frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;

wherein said orientation content ratios A are 50% or less, and said orientation content ratios A have a disperson within ±20% and the (002) plane has orientation content ratios B as measured by X-ray diffraction at various portions of the sputtering surface of the target and calculated on the basis of the numerical formula (2):

$$\text{Orientation content ratio } B = \frac{\frac{I_{(002)}}{R_{(002)}}}{\Sigma \frac{I_{(hkl)}}{R_{(hkl)}}} \quad (2)$$

wherein $$\Sigma \frac{I_{(hkl)}}{R_{(hkl)}} = \frac{I_{(010)}}{R_{(010)}} + \frac{I_{(002)}}{R_{(002)}} + \frac{I_{(011)}}{R_{(011)}} + \frac{I_{(012)}}{R_{(012)}} +$$

$$\frac{I_{(110)}}{R_{(110)}} + \frac{I_{(103)}}{R_{(103)}} + \frac{I_{(200)}}{R_{(200)}} + \frac{I_{(112)}}{R_{(112)}} +$$

$$\frac{I_{(201)}}{R_{(201)}} + \frac{I_{(004)}}{R_{(004)}} + \frac{I_{(202)}}{R_{(202)}} + \frac{I_{(014)}}{R_{(014)}} +$$

$$\frac{I_{(203)}}{R_{(203)}} + \frac{I_{(211)}}{R_{(211)}} + \frac{I_{(114)}}{R_{(114)}} + \frac{I_{(212)}}{R_{(212)}} +$$

$$\frac{I_{(015)}}{R_{(015)}} + \frac{I_{(204)}}{R_{(204)}} + \frac{I_{(300)}}{R_{(300)}} + \frac{I_{(213)}}{R_{(213)}} +$$

$$\frac{I_{(302)}}{R_{(302)}}$$

where $I_{(hkl)}$ is the peak intensity of the (hkl) plane obtained by X-ray diffraction and $R_{(hkl)}$ is the relative intensity ratio of the (hkl) plane;

wherein said orientation content ratios B are 20% or less.

\* \* \* \* \*